United States Patent
Veinblat (10) Patent No.: US 7,046,090 B2
(45) Date of Patent: May 16, 2006

(54) METHOD AND APPARATUS FOR DYNAMICALLY REGULATING THE SUPPLY VOLTAGE OF A POWER AMPLIFIER

(75) Inventor: Alexander Veinblat, Haifa (IL)

(73) Assignee: Paragon Communications Ltd., Haifa (IL)

( * ) Notice: Subject to any disclaimer, the term of this patent is extended or adjusted under 35 U.S.C. 154(b) by 0 days.

(21) Appl. No.: 10/911,949

(22) Filed: Aug. 5, 2004

(65) Prior Publication Data

US 2005/0057308 A1    Mar. 17, 2005

Related U.S. Application Data

(63) Continuation of application No. PCT/IL04/000522, filed on Jun. 16, 2004.

(60) Provisional application No. 60/478,765, filed on Jun. 16, 2003.

(51) Int. Cl.
*H03G 3/30* (2006.01)
*H03F 3/04* (2006.01)

(52) U.S. Cl. .................. 330/285; 330/296; 330/297

(58) Field of Classification Search ............. 330/285, 330/296, 297
See application file for complete search history.

(56) References Cited

U.S. PATENT DOCUMENTS

| | | | |
|---|---|---|---|
| 5,396,194 A | 3/1995 | Williamson et al. ........ 330/297 |
| 5,604,924 A * | 2/1997 | Yokoya ...................... 330/297 |
| 5,670,911 A | 9/1997 | Hori et al. .................. 330/277 |
| 6,163,706 A * | 12/2000 | Rozenblit et al. ........... 330/297 |
| 6,566,944 B1 * | 5/2003 | Pehlke et al. ................. 330/10 |
| 6,646,511 B1 * | 11/2003 | Canyon et al. ............. 330/297 |
| 6,774,725 B1 * | 8/2004 | Miki et al. .................. 330/297 |
| 2004/0061555 A1 * | 4/2004 | Lynch ........................ 330/136 |

FOREIGN PATENT DOCUMENTS

| | | |
|---|---|---|
| EP | 0618673 | 10/1994 |
| WO | 9534128 | 12/1995 |
| WO | 0048306 | 8/2000 |
| WO | 0167598 | 9/2001 |

* cited by examiner

*Primary Examiner*—Khanh V. Nguyen
(74) *Attorney, Agent, or Firm*—Marsteller & Associates, P.C.

(57) ABSTRACT

A method for regulating the power supplied to an amplifier by providing the power supply input of the amplifier with a current via a coil or a diode connected to a constant voltage power supply, and with additional current diverted from a controlled current source, wherein the magnitude and direction of the additional current is adjusted according to a modulating signal.

24 Claims, 6 Drawing Sheets

METHOD AND APPARATUS FOR DYNAMICALLY REGULATING THE SUPPLY VOLTAGE OF A POWER AMPLIFIER

CROSS-REFERENCE TO RELATED APPLICATIONS

This application claims the benefit of U.S. Provisional Patent Application No. 60/478,765 filed on Jun. 16, 2003, the entire disclosure of which is incorporated herein by reference. This application is a continuation of co-pending International Application PCT/IL2004/000522 filed Jun. 16, 2004, which designates the United States, and neither the International Application nor the designation of the United States has been withdrawn nor considered withdrawn prior to the filing date hereof.

BACKGROUND OF THE INVENTION

1. Field of the Invention

The present invention relates to the field of radio-frequency power amplifiers. More particularly, the invention relates to a method and apparatus for regulating the supply voltage of a power amplifier operating under large peak-to-average ratios.

2. Background

Dynamic regulation of amplifiers' supply voltage is particularly required in envelope restoration systems and in high-efficiency modulation schemes such as collector, drain or anode modulation, and it may also be used in radar or other pulse amplifier systems. Such regulation of power supply is also required in applications which require generation of pulses with complex envelope modulation patterns, and in optical systems wherein there is a need to modulate an optical channel or an optical transmitter according to a predetermined modulation law.

Efficient amplification of RF signals having varying envelope patterns and peak to average ratios of about 8–11 dB is a common problem in cellular communication systems. Typical RF Amplifiers (RFAMP) are usually not efficient under these operating conditions, mostly due to the low value of the average amplified signal power and due to design requirements of keeping sufficient headroom for amplifying signal peak leads by a larger amplifier with greater DC consumption.

Figure 1:
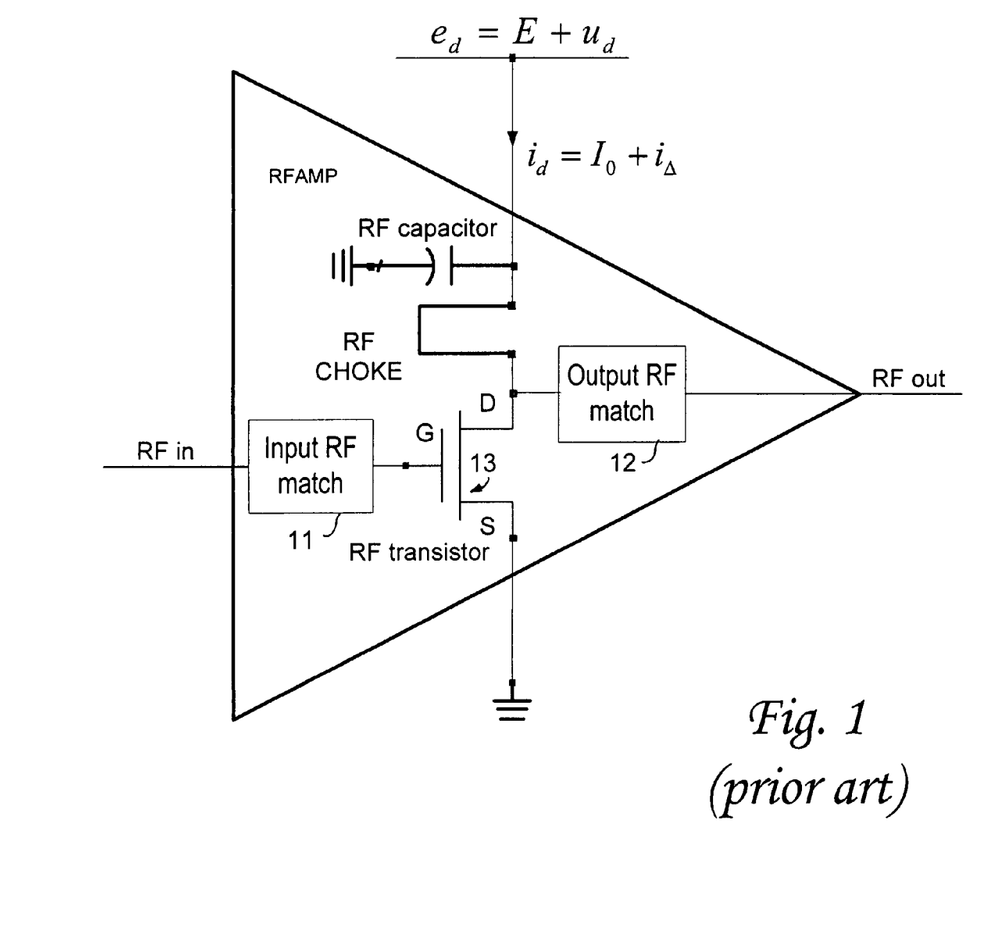
FIG. 1 is a block diagram exemplifying the structure of a typical RF amplifier.

An example of a typical single-ended RF amplifier is depicted in FIG. 1. The notation used in this example, and in other examples to follow, utilize lower case letters to designate variables that are functions of time (the time parameter t is omitted), e.g., e=e(t), and upper case letters to designate constant values e.g., E. For the purpose of simplicity, the Input RF match and the Output RF match components of the amplifier are generally shown as blocks 11 and 12 of the RFAMP 10 in FIG. 1.

Some of the terms that are used herein will now be explained for the sake of clarity. In general, RF signals may be presented as the amplitude-phase modulation of an RF tone. The term video envelope is used herein to refer to the amplitude modulation component of the amplified RF signal. The term video current is used herein to refer to the video envelope of the current flowing though the amplifier's active element (e.g., RF transistor) while it amplifies an RF signal. The term video match generally refers to circuitry that accepts the video current and delivers power supply voltage to the amplifier's active element accordingly.

The supply voltage $e_d = E + u_d$ is applied to the drain of the RF transistor 13 shown in FIG. 1, at a contact point which is generally referred to herein as "power supply input", where $u_d$ is the varying (alternating) component and E is the constant component of the supply voltage $e_d$. For example, in a classical RF amplifier, fluctuations of the voltage $u_d$ are not desirable and thus made as low as possible by an appropriate design of the drain video match circuit 12. The drain current $i_d = I_0 + i_A$, consumed by the RF transistor 13 during signal amplification, includes a constant component $I_0$, and a varying component (video envelope current) $i_A$ which is an alternating component having a zero average value i.e., having positive and negative values. It is assumed that RF currents and voltages do not have considerable influence on the values of $i_d$ and $e_d$, due to an appropriate RF filter (not shown) inside the RFAMP 10, such that their influence may be neglected.

One of the known solutions for the problem described above, which aims to improve RF amplifiers' efficiency, is performing dynamic regulation of the supply voltage of the RF amplifier, and thereby adjusting the supply voltage to be proportional to the envelope of the amplified signal. Usually, a fixed constant voltage E is applied when the magnitude of the video envelope of the amplified signal is lower than a predetermined threshold level. In this way, the consumed DC power is decreased while its linearity is kept at an acceptable level by choosing an appropriate value for the supply voltage E. When the envelope magnitude is larger than the predetermined threshold level, an additional positive voltage $u_d$ is added to the supply voltage E. The application of this additional voltage is also known as "voltage enhancement".

Since the consumed DC power is mostly increased due to the amplifying of the video envelope peaks, that are usually not so frequent, efficiency may be improved by utilizing proper dynamic regulation of the supply voltage $e_d = E + u_d$.

The main problem in dynamic regulation of the supply voltage $e_d(t)$ is to perform this regulation efficiently and rapidly, since the supply voltage $e_d(t)$ should be regulated at real time, and kept in proportions with the video envelope of the amplified signal. For example, it is a difficult task to achieve a response delay of $e_d(t)$ which is less than 10 ns with bandwidths of about 50MHz utilizing a typical balanced cellular amplifier having a peak DC power consumption of about 400W. State of the art DC-DC converters, that potentially may provide a convenient solution, cannot so far satisfy the above mentioned response delay time and bandwidth requirements.

Some of the prior art solutions, for example WO95/34128 or WO01/67598, are based on variations of the following scheme. A fraction of an extra fixed supply voltage required is dynamically added to the main supply voltage, and in this way the supply voltage of the RF amplifier is kept in proportions with the video envelope of the amplified signal. In other words, there is a fast and powerful video envelope pulse amplifier having its output combined with a constant supply voltage of an RF amplifier.

However, there are some disadvantages associated with such methods mainly since fast and efficient analog combining of power supplies is difficult to achieve, and since the constant voltage of the extra supply sources sets a limit to the maximal possible voltage enhancement that can be obtained. Moreover, the analog pulse amplifier demands very fast, powerful and thus expensive transistors to meet the low response delay requirements.

On the other hand, binary switching between power supplies does not enable to achieve linear dynamic regulation of the supply voltage, which preferably should be proportional to the video envelope of the amplified signal.

Another problem associated with binary switching solutions is that rapid binary voltage and current fluctuations at the drain of the RF transistor spoils the linearity of the amplifier.

Another difficulty associated with power supply regulation implementations is to ensure that the undesirable voltage fluctuations of $u_d$, obtained due to the fluctuations of the video envelop current $i_A$, are kept as low as possible. In most cases this is achieved by providing a good ground for variable video envelope current $i_A$, when there are no voltage enhancement of $e_d$. Obviously, once such good grounding is achieved the spectral purity of the amplified signal will be significantly improved.

All the methods described above have not yet provided satisfactory solutions for improving the efficiency and performance of dynamically regulated supply voltage of power amplifiers.

It is an object of the present invention to provide a method and apparatus for regulating the supply voltage of an amplifier without carrying out summation of voltage sources.

It is another object of the present invention to provide a method and apparatus for regulating the supply voltage of an amplifier in proportions with the envelope of the amplified signal and with minimal delay.

Other objects and advantages of the invention will become apparent as the description proceeds.

SUMMARY OF THE INVENTION

The present invention is directed to a method and system for regulating the power supplied to an amplifier. In a preferred embodiment of the invention the power supply input of the amplifier is preferably provided with a current via a coil (inductor) or a diode connected to a constant voltage power supply, and additional current is diverted from a controlled current source into the power supply input of the amplifier, where the magnitude and direction of the additional current is adjusted according to a modulating signal.

The dynamic regulation of supply voltage of the amplifier may be carried out according to a modulating signal, according to the following steps:

(a) providing the amplifier with power from a constant voltage supplied via a reactive element, such as a coil, and/or via a diode, via its power supply input;
(b) continuously sampling the modulating signal of the amplifier;
(c) providing a feedback signal by continuously sampling the supply voltage; and
(d) regulating the power supply voltage of the amplifier by diverting current from a controlled current source into the power supply input of the amplifier;

wherein the diverted current is determined according to the sampled modulating signal and the feedback signal to achieve proportionality between the regulated voltage and the modulating signal.

The modulating signal may optionally be proportional to the value of an input signal provided to the amplifier, or alternatively it may be an arbitrary signal.

The controlled current source may comprise a constant current source and a controlled current sink, and the diverted current may be obtained by adding the currents of the constant current source and of the controlled current sink.

Alternatively, the controlled current source may comprise a constant current source and a controlled current source that are connected to a controlled current sink, and the diverted current may be obtained by adding the currents of the constant current source, of the controlled current source, and of the controlled current sink.

Optionally, the modulating signal is proportional to an input signal of the amplifier whenever the value of the signal is above a predetermined threshold.

The value of the diverted current is preferably determined according to the envelope of the input signal of the amplifier. The diverted current may be provided to the power supply input of the amplifier via a capacitor.

Preferably, the constant current source comprises an inductor connected in series with a DC power supply of constant current or constant voltage, the controlled current source may comprise a voltage source and a controlled current sink connected in series, and the controlled current sink is preferably implemented by utilizing a FET or bipolar transistor.

The proportionality between the regulated voltage and the input signal is preferably achieved whenever the value of the signal is above a predetermined threshold.

DETAILED DESCRIPTION OF PREFERRED EMBODIMENTS

The present invention provides a scheme for regulating supply voltage ($e_d$) of an amplifier in proportion with the modulation signal $s_m$. One preferred embodiment of the invention is shown in FIG. 3 wherein a Controlled Current Source 108 is utilized for regulating the source voltage $e_d$ of amplifier 106.

Figure 2A:
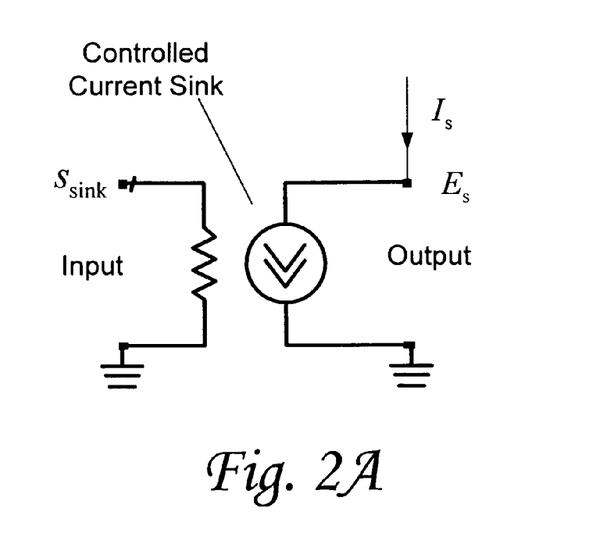
FIGS. 2A–2C demonstrate the principle of the controlled current sink.

In the following discussion reference is made to the "Controlled Sink of Current" (CSC, also referred to as Controlled Current Sink) element, a symbolic representation of which is shown in FIG. 2A. This element (CSC) is characterized by its ability to absorb a current $I_s$ at its output. The way it absorbs the current $I_s$ depends on its input control signal $s_{sink}$, that defines a parameter $I_{sink}$. The parameter $I_{sink}$ is a function of the controlling signal $s_{sink}$ applied at the CSC input terminals, and it does not depend on the voltage $E_s$ over the CSC output terminals. If the output current $I_s$ is smaller than $I_{sink}$ ($I_s < I_{sink}$), then the output voltage $E_s$ of the CSC is ideally zero (i.e., $E_s = 0$), and if the value of the output current $I_s$ is equal to, or larger than, the parameter $I_{sink}$ ($I_s >= I_{sink}$), then the output voltage $E_s$ of the CSC is nonzero ($E_s \neq 0$) and its sign corresponds to the direction of the output current $I_s$. For example, if a voltage $E_s$ is applied to the output terminals of the CSC, and a parameter $I_{sink}$ is set by the controlling signal $s_{sink}$, then the value of the output current $I_s$ will be equal to the value of $I_{sink}$.

Figure 2B:
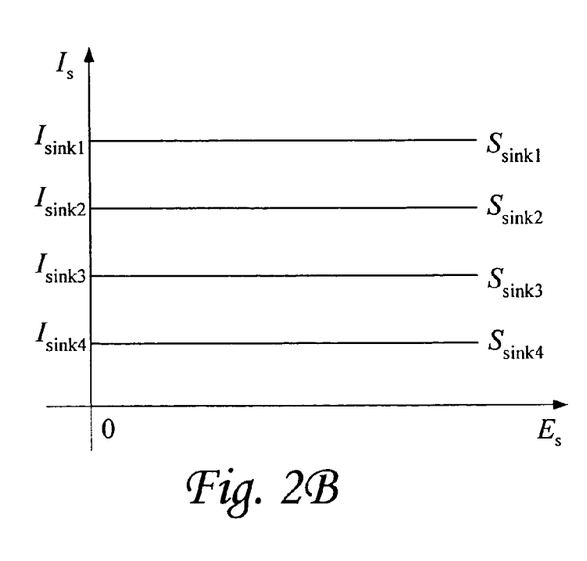
Figure 2C:
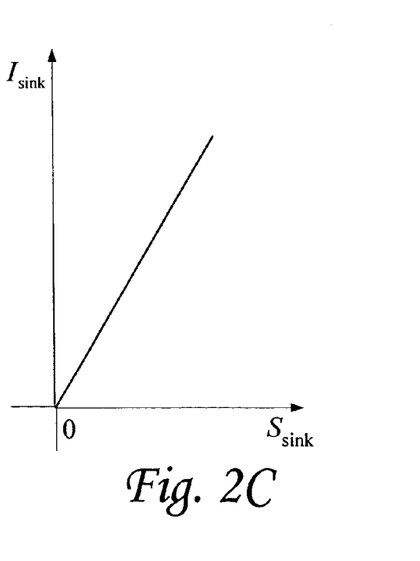

An illustration of an ideal CSC output characteristic is shown in FIG. 2B, while an illustration of CSC input to output characteristic is shown in FIG. 2C. For example, a close approximation of an ideal CSC is a MOSFET, wherein its gate-source characteristics correspond to the input characteristics of a CSC, and wherein the drain-source characteristics correspond to the output characteristics of a CSC.

Figure 3:
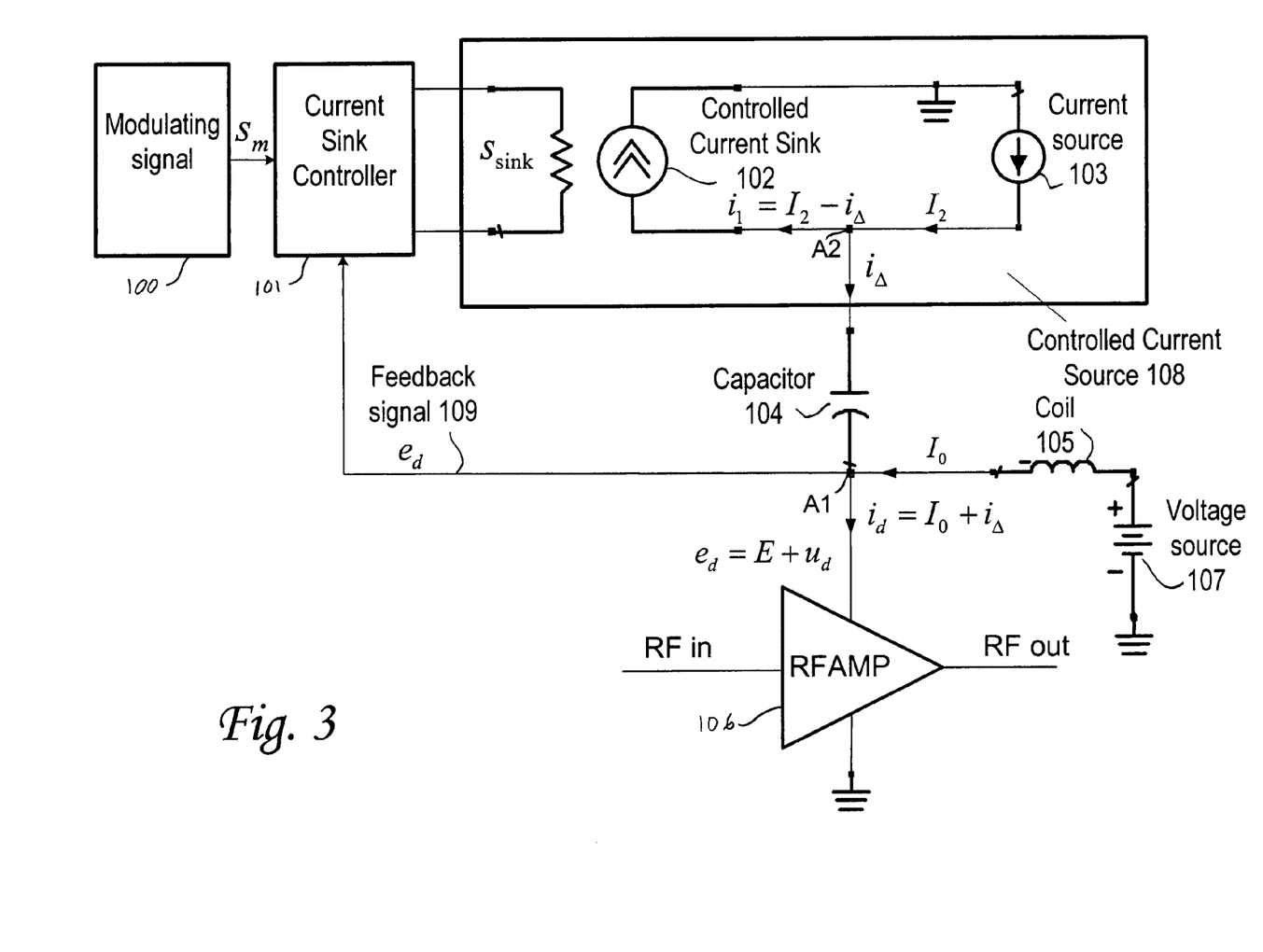
FIG. 3 is a block diagram exemplifying one preferred embodiment of the invention for regulating amplifier source voltage utilizing a controlled current sink and a constant current source for regulating the amplifier's power supply.

FIG. 3 shows a block diagram of a preferred embodiment of the invention. The Current Source 103 provides a constant current $I_2$, the value of which should be large in compare to any peak of the video envelope current $i_d$ that may occur. The CSC 102 together with the Current Source 103 form a Controlled Current Source (CCS) 108, that can drive the power supply input of RFAMP 106 with positive and negative video envelope currents $i_A$.

The Current Source 103 provides a constant current $I_2$ while the voltage across its output terminals, i.e., at A2 point, is fluctuating. These requirements may be achieved for example by utilizing a non-ideal DC current or voltage source connected in series with an inductivity (e.g., coil). In order to achieve high efficiency, this non-ideal current or voltage source may be a type of DC-DC or AC-DC converter. The inductivity should be sufficiently large in order to maintain approximately constant current through it while the voltage is fluctuating at A2.

Current source 103 is connected to the CSC 102 and to the Capacitor 104 such that the current $I_2$ is divided at the connection point A2 into the current $i_1$ branched into the CSC 102 and current $i_A$ (video envelope current) passing through the Capacitor 104. The control signal $s_{sink}$ at the input of CSC 102 determines the value of the CSC current, which in the preferred embodiment of the invention absorbs the current $i_1 = I_{sink}$. The connection of the CSC 102, Current Source 103, and Capacitor 104, at A2, ensures that the currents distribution satisfies the currents law $i_1 = I_2 - i_A$, and therefore it is possible to control the magnitude of the video envelope current $i_A$ by varying the magnitude of the current $i_1$, driven by the CSC 102, according to the value of the control signal $s_{sink}$.

The modulating signal $s_m$ is provided via the Modulating signal unit 100. For example, $s_m$ may be equal to the video envelope of the amplified signal. However, in the general case $s_m$ is arbitrary. The Current Sink Controller 101 produces a control signal $s_{sink}$ that adjusts the sink current $i_1$ through CSC 102 according to the value of the modulating signal $s_m$ input received from the Modulating signal unit 100, the value of the feedback signal $e_d$ received on input 109, and according to the value of the predetermined threshold level. For example, according to a control law in a preferred embodiment of the invention, an increase in the value of the signal $s_m$ results in a decrease in the value of the signal $s_{sink}$, while an increase of the value of $e_d$ results in an increase in the value of the signal $s_{sink}$ e.g., $$s_{sink} = \begin{cases} S_{const} & \text{if } s_m < \text{Threshold} \\ S_{const} - \alpha \cdot s_m + \beta \cdot e_d & \text{if } s_m \geq \text{Threshold} \end{cases},$$

where $S_{const}$, $\alpha$ and $\beta$ are constants.

When there is no need for voltage regulation ($S_m$<Threshold), for example, the input video envelope signal is less than the predetermined threshold, and $s_{sink}$ is set such that $I_{sink} > I_2 - i_A (= i_1)$. In this case the voltage at the connection point A2 is negligibly small. In a preferred embodiment of the invention the current of the Current Source 103 is set to provide a large and constant current $I_2(>0)$. If $i_1 < I_{sink}$ a zero potential over the output terminals of the CSC 102 is obtained in steady state due to the behavior of the CSC. For example, when implementing the CSC 102 using a MOSFET the output voltage when $i_1 < I_{sink}$ is negligibly small ($E_0 \to 0$). This behavior is achieved because the value of the parameter $I_{sink}$ is initially set to a value $I_{sink} = f(S_{const})$ which should be larger than $I_1 - i_A$ for all possible values of $i_A$ (i.e., when of the power supply voltage is not required).

When regulation of $e_d$ is required ($S_m$>Threshold), for example, the input video envelope signal is larger than the predetermined threshold, and $s_{sink}$ is decreased by the Current Sink Controller 101 such that $i_1$ is smaller than $I_2$, so a portion of current $i_A$ is diverted from the Current source 103 through Capacitor 104. The Controller 101, using the feedback signal 109, ensures that the amount of current $i_A$ provides the required drain voltage ed. In other words, CCS 108 drives the necessary video envelope current $i_A$ into the power supply input of the RF amplifier 106 according to variations of the detected video envelope.

In this way the undesirable fluctuations of the supply voltage $e_d$ of the power amplifier 106 are maintained negligibly low, which is an additional advantage over known prior art prototypes. In this embodiment of the invention, there is no need for the additional fixed voltage source, as required by the prior art, of sufficiently high voltage for voltage enhancement, for providing the peak value of the required voltage $u_d$.

The Voltage Source 107 is the main power supply in the embodiment shown in FIG. 3. The current $I_0$ flowing through Voltage Source 107 is the average current of RFAMP 106. The Capacitor 104 acts as a DC buffer between the connection points A1 and A2.

The Coil 105 prevents the video envelope current $i_A$ from flowing through the Voltage Source 107, and thus prevents fluctuations of the main current $I_0$. A similar result can be achieved by replacing the Coil 105 with a diode, however the Coil 105 also prevents occurrence of abrupt changes in the value of the current $I_0$. Without any loss of generality, and for the sake of simplicity of the forgoing discussion, it is assumed that inductance of the Coil 105 and the capacitance of the Capacitor 104 are sufficiently large in order to provide that:

(1) only the constant part $I_0$ (DC component) of the drain current $i_d$ flows through the Coil 105, and that (2) the voltage variations over the terminals of the Capacitor 104, which are due to the variable component of the drain current $i_d$, are considerably small.

The RF amplifier 106 is powered by the constant Voltage Source 107 through the Coil 105, the drain current $i_d$ therefore comprises a constant component $I_0$ and a variable component $i_A$, which is associated with the video envelope of the amplified signal. The current $i_d = I_0 + i_A$ is divided between the Coil 105 ($I_0$) and the Capacitor 104 ($i_d$), such that its constant part $I_0$ flows through the Coil 105 while the alternating video envelope current $i_A$ flows through the Capacitor 104.

In principle, the regulating scheme of the invention is performed as follows: the Current Sink Controller 101 monitors the modulating (control) signal $s_m$ and the feedback signal $e_d$ on 109, and provides, according to a predetermined threshold level, a controlling signal $s_{sink}$ which controls the variations of the current $i_1$ through the CSC 102 and consequently cause variations of the drain voltage $e_d$ at connection point A1, which are proportional to the modulating signal $s_m$.

Figure 4A:
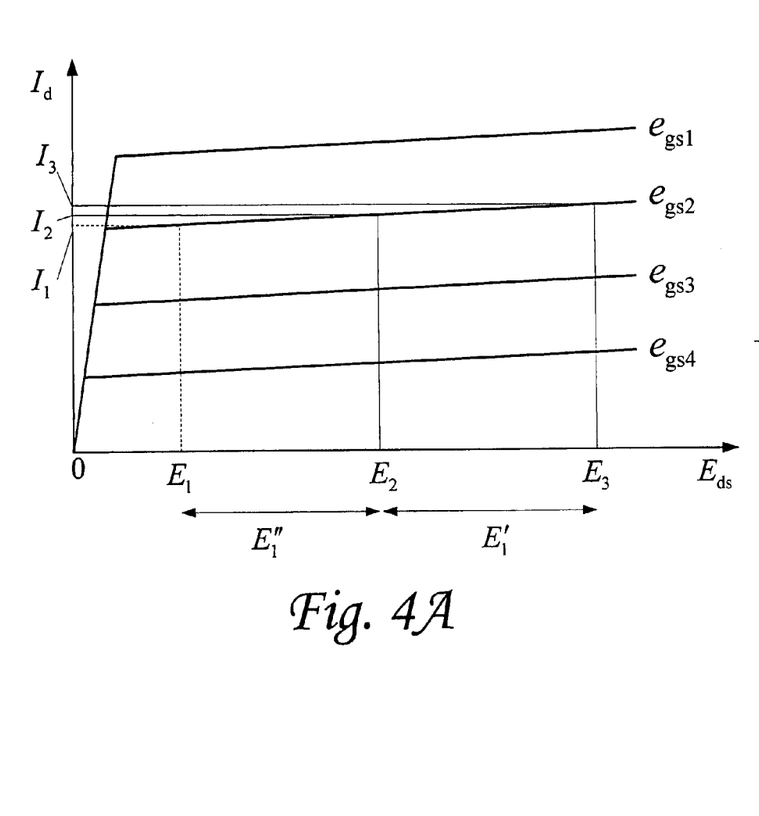
FIGS. 4A–4B are voltage and current graphs demonstrating source voltage regulation of a preferred embodiment of the invention, shown in FIG. 3.

This principle of voltage regulation at the drain of a MOSFET will now be further explained with reference to the graphs in FIGS. 4A and 4B. The graph shown in FIG. 4A. demonstrates a typical output characteristic of a MOSFET used as RF amplifier. In this example, the voltage and current pair ($E_2$, $I_2$) characterizes a working point on a MOSFET output characteristic for an instant $e_{gs2}$. If an additional current I' is injected into the drain-source of the MOSFET, then the working point slides to a new location ($E_3$, $I_3$), for which the drain current $I_3=I_2+I'$ and the new drain voltage $E_3=E_2+E'$ is larger than the initial voltage $E_2$.

On the other hand, if the magnitude of the drain current $I_2$ is reduced by an amount of I", then the working point is changed accordingly into a new location ($E_1$, $I_1$) wherein $I_1=I_2-I''$, $E_1=E_2-E''$, in which the new drain voltage $E_1$ is lower than initial voltage $E_2$.

Figure 4B:
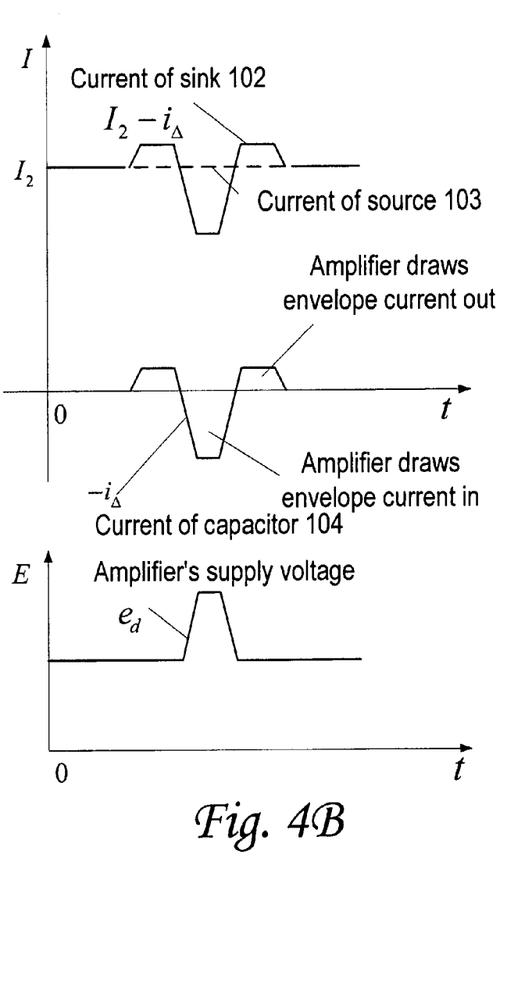

The graph shown in FIG. 4B demonstrates the currents: $I_2-i_A$ through CSC 102, $-i_A$ through Capacitor 104, and drain voltage $e_d$. The direction of the currents corresponds to arrows shown in FIG. 3, at the point A2. While RFAMP 106 is amplifying a peak of the RF signal (e.g., $S_m$>Threshold), it is consuming the corresponding video envelope current $i_A$. The current $i_1$ absorbed by CSC 102 is changed (e.g., decreased) accordingly due to the variations in the value of the controlling signal $s_{sink}$. A portion of current $i_A$, corresponding to the required drain voltage $e_d$ is thus diverted via the Capacitor 104 from the Current Source 103. Since this portion of current is larger than that needed for a constant drain voltage, the amplifier's drain voltage $e_d$ is changed in proportions with the changes in the video envelope current $i_A$.

During the amplification of the RF signal the Current Sink Controller 101 is continuously adjusting the control signal $s_{sink}$ according to the input signal $s_m$ and the feedback signal $e_d$ on 109. While the signal amplified by amplifier 106 requires less power consumption, the amplifier's drain current $i_d$ is decreasing respectively, and in effect, the current $i_A$ through the Capacitor 104 is reversed i.e., it is absorbed by CSS 102, without any undesired voltage fluctuations of the amplifier's supply voltage $e_d$.

The regulating scheme of the invention enables predictable and controllable variations of the drain voltage $e_d$ to occur due to the additions or subtractions of current $i_A$ to/from the drain-source current $i_d$ of the amplifying transistor. The feedback signal on 109 which is used for monitoring the drain voltage $e_d$, helps to deliver the necessary amount of additional current to keep the drain voltage $e_d$ proportional to $s_m$.

Figure 5:
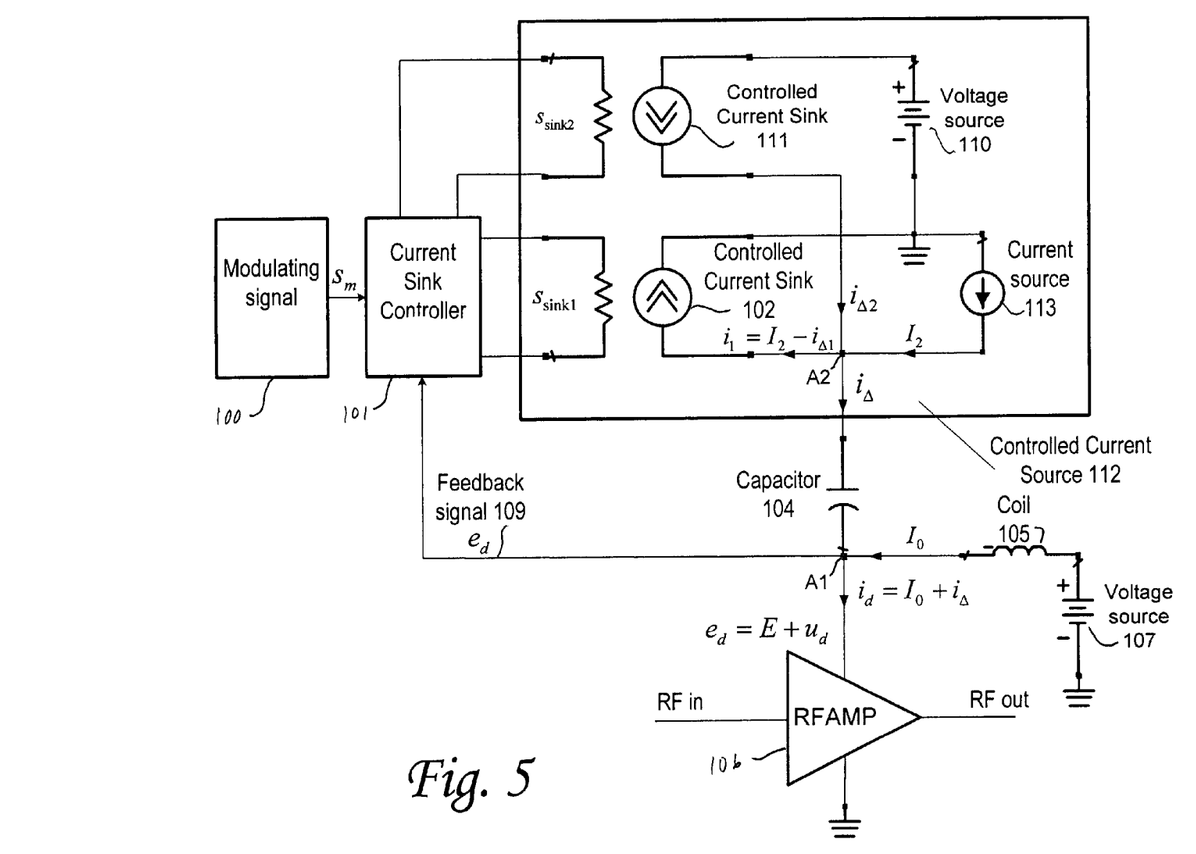
FIG. 5 is a block diagram exemplifying another preferred embodiment of the invention for regulating amplifier's source voltage utilizing a controlled current sink, a constant current source and an additional controlled current sink connected to a constant voltage source.

Another preferred embodiment of the invention is shown in FIG. 5, wherein the Controlled Current Source 112 utilized includes a CSC 102, a CSC 111, a Voltage source 110, and a Current source 113. The current source 113 in this preferred embodiment may be of the same type, as the current source 103 shown in FIG. 3.

This embodiment demonstrates a scheme for regulating the amplifier's power supply voltage $e_d$ by controlling the video envelope current $i_A$, which is similar to the regulating scheme described above with reference to FIG. 3, but which differs in the way of diverting the required current $i_A$ between the components of the CCS 112.

Figure 6:
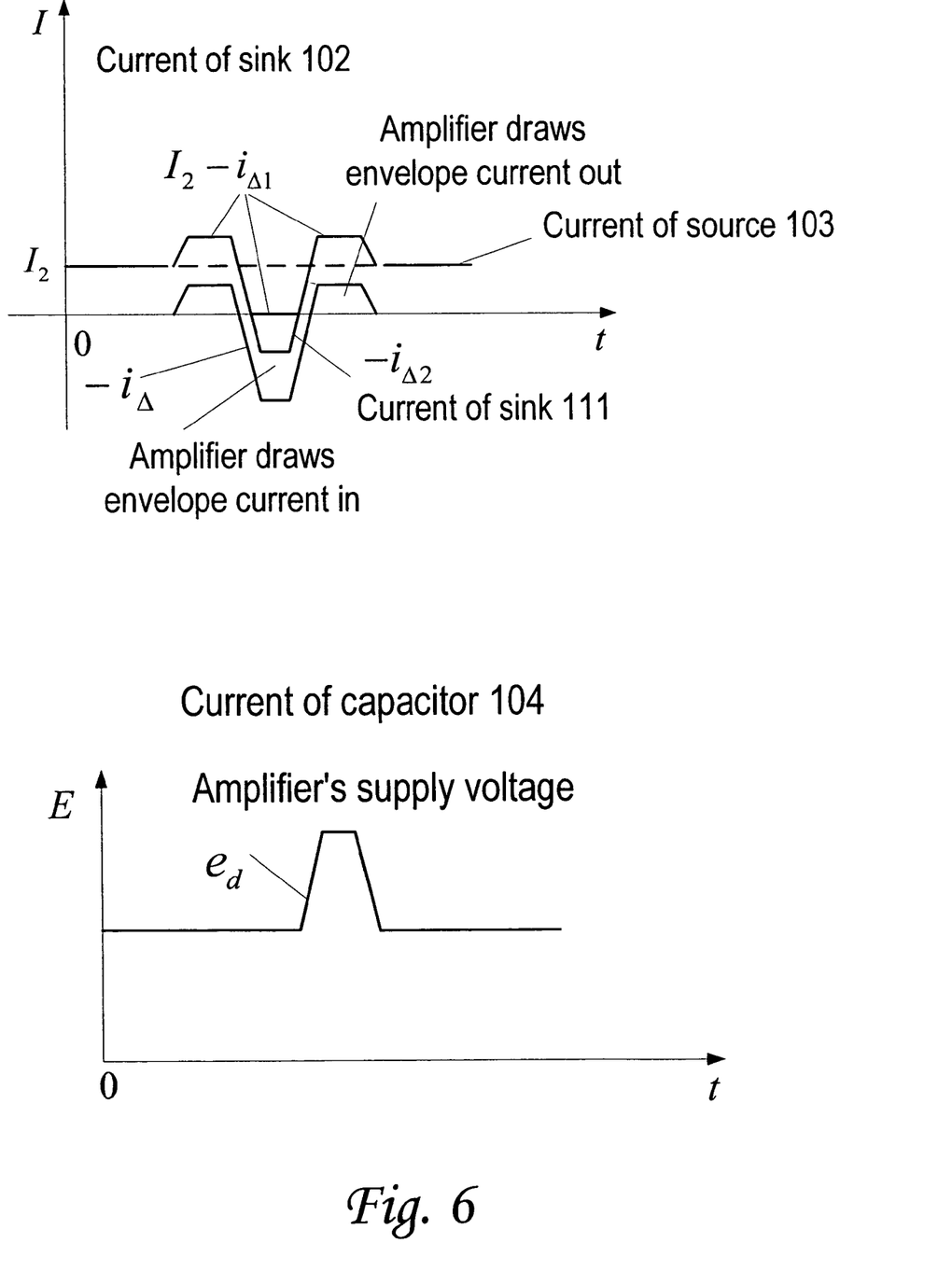
FIG. 6 illustrates voltage and current graphs demonstrating source voltage regulation of a preferred embodiment of the invention, shown in FIG. 5.

An example of currents diversion is illustrated in FIG. 6. The Current Sink Controller 101 continuously samples the modulating signal $S_m$ and the feedback signal 109, and sets corresponding signals $S_{sink2}$ and $S_{sink1}$ to maintain $i_A=i_{A1}+i_{A2}$ at the connection point A2.

The Voltage source 110 together with CSC 111 form a controllable current source, which its current $i_{A2}$ is controlled by the signal $S_{sink2}$. Whenever the value of the video envelope current $i_A$ of the amplifier 106 is smaller than the current $I_2$ of Current Source 113 ($i_A<I_2$), CSC 111 is switched off by setting a proper input signal $S_{sink2}$, and therefore in such cases its current $i_{A2}$ is equal to zero and $i_A=i_{A1}$.

However, if $i_A>I_2$, i.e., the current $I_2$ is not sufficiently large to provide the required video envelope current $i_A$, the signal $S_{sink2}$ is set accordingly to enable CSC 111 to divert the additional current $i_{A2}$, required in order to provide the video envelope current $i_A=i_{A1}+i_{A2}$. In this preferred embodiment of the invention the value of the constant current $I_2$, provided by the Current Source 113 may be set to be lower than the peak value of the video envelope current $i_A$, such that a proper choice of the value of $I_2$ improves the efficiency of dynamic voltage regulation.

It should be noted that the voltage regulating scheme of the invention may be also applied to other types of amplifying elements having similar output ampere-volt characteristics, such as bipolar transistors or tubes, and with passive linear or non-linear loads, such as resistors, coils and the like.

The above examples and description have of course been provided only for the purpose of illustration, and are not intended to limit the invention in any way. As will be appreciated by the skilled person, the invention can be carried out in a great variety of ways, employing techniques different from those described above, all without exceeding the scope of the invention.

What is claimed is:

1. A method for dynamic regulation of supply voltage of an amplifier according to a modulating signal, comprising:
    (a) providing said amplifier with power from a constant voltage source supplied via a reactive element or a diode, via its power supply input;
    (b) continuously sampling said modulating signal of said amplifier;
    (c) providing a feedback signal by continuously sampling said supply voltage; and
    (d) regulating the power supply voltage of said amplifier by diverting current from a controlled current source into said power supply input of said amplifier;
wherein said diverted current is determined according to the sampled modulating signal and said feedback signal to achieve proportionality between said regulated voltage and said modulating signal.

2. A method according to claim 1 wherein the modulating signal is proportional to the value of an input signal provided to the amplifier.

3. A method according to claim 1, wherein the controlled current source comprises a constant current source and a controlled current sink.

4. A method according to claim 3, wherein the diverted current is obtained by adding the currents of the constant current source and of the controlled current sink.

5. A method according to claim 1, wherein the controlled current source comprises a constant current source and a second controlled current source that are connected to a controlled current sink.

6. A method according to claim 5, wherein the diverted current is obtained by adding the currents of the constant current source, of the second controlled current source, and of the controlled current sink.

7. A method according to claim 1, wherein the modulating signal is proportional to an input signal of said amplifier whenever the value of said input signal is above a predetermined threshold.

8. A method according to claim 1, wherein the value of the diverted current is determined according to the envelope of the input signal of the amplifier.

9. A method according to claim 1, wherein the diverted current is provided via a capacitor.

10. A method according to claim 3, wherein the constant current source comprises an inductor connected in series with a DC power supply of constant current or constant voltage.

11. A method according to claim 5, wherein the second controlled current source comprises a voltage source and a controlled current sink connected in series.

12. A method according to claim 3, wherein the controlled current sink is implemented by utilizing a FET or bipolar transistor.

13. A method according to claim 1, wherein the reactive element is a coil.

14. A method according to claim 1, wherein proportionality between the regulated voltage and the input signal is achieved whenever the value of said signal is above a predetermined threshold.

15. A system for dynamic regulation supply voltage of an amplifier according to a modulated signal, comprising:
 a) power supply for continuously supplying an essentially constant DC current to said supply input, said power supply connected to said supply input via a reactive element or a diode;
 b) circuitry for continuously sampling, thereby obtaining the level of the modulating signal;
 c) circuitry for generating a feedback signal by continuously sampling the supply voltage at a supply input; and
 d) a controlled current source, connected, directly or through a capacitor, to said supply input, for absorbing undesired video envelope current, whenever said level does not exceed a predetermined threshold, and for regulating the supply voltage to said amplifier, whenever said level exceeds said predetermined threshold, by diverting additional current, from said controlled current source that is controlled according to said modulating signal and said feedback signal and being connected to said supply input, into said supply input, such that the amount of said additional current is essentially proportional to said level, and such that said amount and the direction of said additional current are adjusted according to said level and said feedback signal.

16. A system according to claim 15, wherein the modulating signal is proportional to the value of an input signal provided to the amplifier, or wherein said modulating signal is arbitrary.

17. A system according to claim 15, wherein the controlled current source comprises a constant current source and a controlled current sink connected directly together.

18. A system according to claim 15, wherein the controlled current source comprises a constant current source and a complementary controlled current source that are directly connected to a controlled current sink.

19. A system according to claim 15, wherein the value of the diverted current is determined according to the envelope of the input signal of an amplifier.

20. A system according to claim 15, wherein the diverted current is provided via a capacitor.

21. A system according to claim 17, wherein the controlled current sink is implemented by utilizing a FET or bipolar transistor.

22. A system according to claim 17, wherein the constant current source comprises a coil connected in series with its output.

23. A system according to claim 18, wherein the complementary controlled current source is a transistor connected in series with a voltage source.

24. A system according to claim 18, further comprising a complementary controlled current source that is also controlled according to the modulating signal envelope and the feedback signal and is also connected directly to said controlled current sink, for diverting another additional current into the supply input, whenever the current branched from the constant current source reaches the maximum value that can be drawn from said source, such that the amount of the additional current is essentially proportional to the level and the feedback signal.

* * * * *